Figure 1:
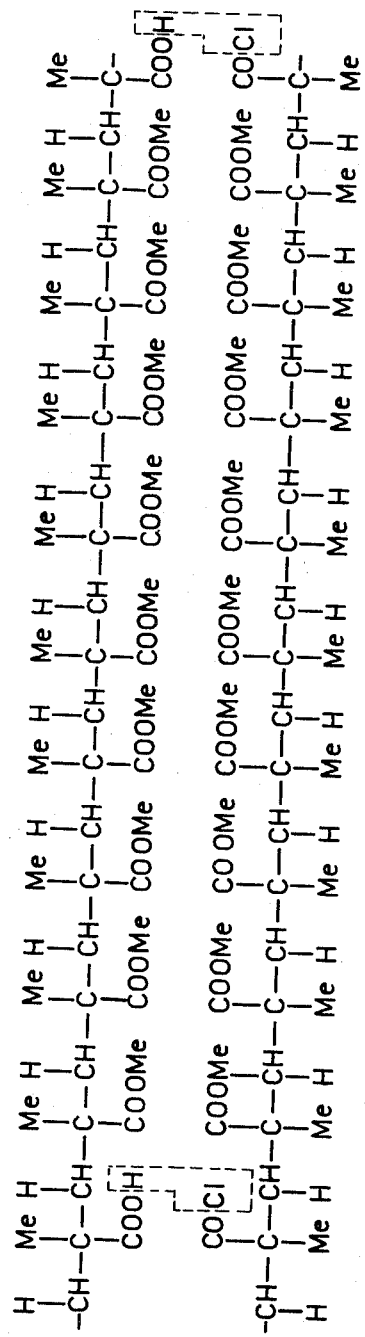

United States Patent [19]
Roberts

[11] 3,981,985
[45] Sept. 21, 1976

[54] POSITIVE-WORKING ELECTRON RESISTS

[75] Inventor: Edward David Roberts, Salfords, near Redhill, England

[73] Assignee: U.S. Philips Corporation, New York, N.Y.

[22] Filed: Dec. 12, 1973

[21] Appl. No.: 424,113

[30] Foreign Application Priority Data
Dec. 21, 1972  United Kingdom............... 59063/72

[52] U.S. Cl.................................. 427/43; 427/44; 427/273; 427/352; 427/372; 96/36.2; 96/68; 204/159.14; 260/78.41; 260/874
[51] Int. Cl.².......................................... B05D 3/06
[58] Field of Search ............... 427/43, 44, 273, 336, 427/352, 372; 260/78.4 R, 78.4 D, 874, 901; 96/35.1, 36.2, 115 R, 68; 204/159.14

[56] References Cited
UNITED STATES PATENTS

| 3,444,144 | 5/1969 | Neale et al. ................... | 260/78.4 R |
| 3,445,530 | 5/1969 | Alpin ............................ | 260/78.4 R |
| 3,526,612 | 9/1970 | Alpin ............................ | 260/78.4 R |
| 3,546,182 | 12/1970 | Izumi et al. .................... | 260/78.4 R |

Primary Examiner—John H. Newsome
Attorney, Agent, or Firm—Frank R. Trifari; Norman N. Spain

[57] ABSTRACT

A cross-linkable positive resist formed from mixtures of a copolymer of an olefinically unsaturated carboxylic acid and an olefinically unsaturated compound having no free acid group and a copolymer of olefinically unsaturated acid chloride and an olefinically unsaturated compound having no acid chloride group.

8 Claims, 5 Drawing Figures

POSITIVE-WORKING ELECTRON RESISTS

This invention relates to a positive-working electron resist which comprises film-forming polymeric materials which are cross-linkable by carboxylic acid anhydride groups and to a method of preparing a resist pattern on a substrate using this resist.

When flim-forming polymeric materials are subjected to the action of ionizing radiation, the material may be broken down into smaller units, or larger units may be formed by cross-linking of the material. Both of these processes occur simultaneously in a system, but one of the processes predominates. If the polymeric material degrades upon irradiation giving products of lower molecular weight, the irradiated material becomes more easily soluble than the non-irradiated polymeric material and can be selectively removed, thus being suitable as a positive-working resist. Few irradiation-degradable polymeric materials are known to be suitable for use as positive-working electron resists, and only poly(methyl methacrylate) (PMMA) has been used to any extent. I. Haller et al (I.B.M. Journ. Res. 12, 251 (1968)) and H. Y. Ku et al (J. Electrochem. Soc. 116, 980 (1969)) describe the use of PMMA films which are suitable for use as an etch resist. M. Hatzakis (J. Electrochem. Soc. 116 1033 (1969)) describes the use of PMMA films for use in the so-called "lift-off" technique for producing metal patterns.

During work which prompted the investigations which led to the present invention, certain difficulties were experienced when attempting to produce gold patterns having submicron details. In developing irradiated portions of a PMMA film, the object is to selectively remove regions consisting of relatively low molecular weight material from regions of higher molecular weight material of similar straight-chain structure, relying on the difference in solubilities of the two materials in the developer. This difference can be considerable at high electron exposures, but it may be so slight at low electron exposures that the non-irradiated material dissolves appreciably in the developer in the time required to dissolve the irradiated material completely.

The present invention provides a positive-working resist which comprises a mixture of co-polymers A-B and D-E, wherein A represents an unsaturated carboxylic acid $$\begin{array}{cc} R_1 & R_2 \\ | & | \\ CH= & C \\ & | \\ & COOH \end{array}$$

B represents an unsaturated organic compound

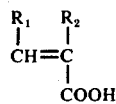

D represents an unsaturated acid chloride

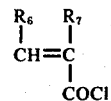

and E represents an unsaturated compound

wherein any of $R_1$, $R_2$, $R_3$, $R_4$, $R_6$, $R_7$, $R_8$ and $R_9$ is a hydrogen atom, an aryl group or a saturated alkyl group, wherein $R_5$ and $R_{10}$ may be the same or different and represent a saturated alkyl group, a saturated acyloxy group, an aryl group or a —COOR group in which R is a saturated alkyl group, wherein the mixture contains stoichio-metric + or −50% quantities of A and D and wherein from 0.5–7.5 mol % of the mixture consists of A. Preferably the saturated alkyl groups are methyl or ethyl groups. Preferably none of the groups $R_4$, $R_5$, $R_9$ and $R_{10}$ is a hydrogen atom, as then the compounds B and D are positive-working materials per se.

A resist pattern may be produced on a substrate by a method which comprises the steps of applying a coating of a cross-linkable positive-working electron resist which comprises a mixture of the co-polymers A-B and D-E as defined above to the substrate, heating the coated substrate so as to form carboxylic acid-anhydride cross-links between the groups A and D of the co-polymers A-B and D-E, irradiating the cross-linked resist coating with electrons in accordance with a desired pattern until the acid-anhydride cross-links have been broken, and developing the irradiated coating by means of a solvent so as to leave the positive resist pattern on the substrate.

The non-irradiated resist film is cross-linked and the cross-linked material is insoluble in the solvents in which the monomers A, B, D and E and co-polymers A-B and D-E are normally soluble. Irradiation destroys these carboxylic acid anhydride cross-links restoring the readily soluble straight chain forms. When developing an irradiated pattern in such a resist film, it is only necessary for the developer to distinguish between soluble (irradiated) and insoluble (non-irradiated) regions, and therefore the time of development is less critical than is the case for PMMA. More active developing solvents may be used than can be used with PMMA, so that the development of the pattern may be more sensitive than is the case for PMMA. The irradiated coating may be developed, for example with acetone, methyl ethyl ketone, methyl isobutyl ketone or toluene. The developed film pattern which is crosslinked, is more resistant to thermal deformation than are standard PMMA patterns.

The non-irradiated material can be removed from a substrate (after it has been used as a mask) by soaking in a mixture of ammonia and a solvent, for example acetone. The ammonia breaks the anhydride group to form amides while the acetone removes the polymer chain material. This permits resists according to the invention to be used on substrates, for example aluminium substrates, which cannot withstand the action of fuming nitric acid, which is often used as a resist remover.

When the resist coating after heating does not consist substantially entirely of cross-linked material, but contains homopolymers A-B or C-D, it may be necessary before irradiation of the coating with electrons to leach uncross-linked material from the coating by means of a solvent, as in Examples 3 to 7 below. The co-polymers A-B and D-E used in Examples 3 to 7 were probably incompletely reacted, the best combination of catalyst and reaction conditions has not yet been established for these systems.

Figure 2:
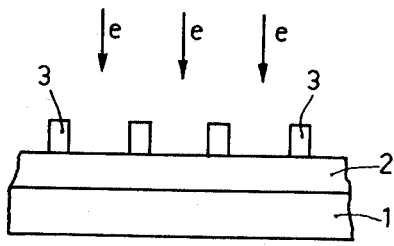
Figure 3:
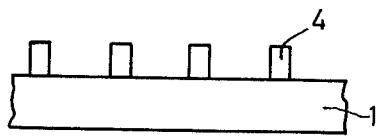
Figure 4:
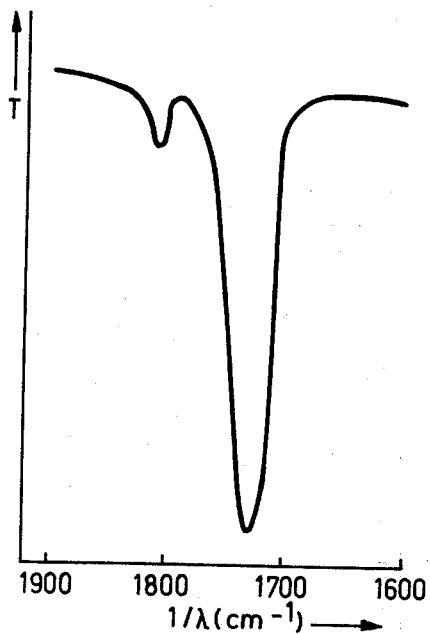
Figure 5:
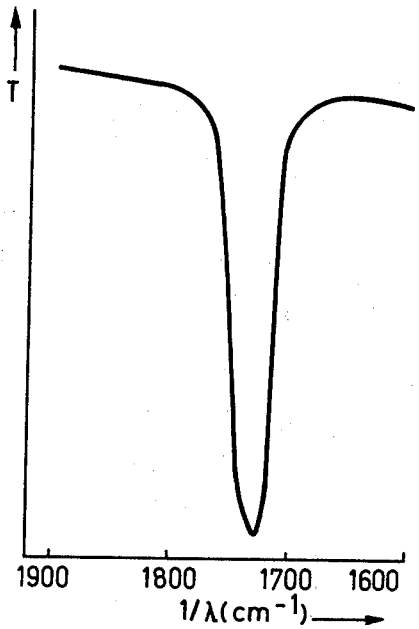

Some embodiments of the invention will now be described with reference to the following Examples and to the accompanying drawings, in which:

FIG. 1 shows schematically the composition of a copolymer mixture described in Example 1 which contains 5 mol % of methacrylic acid, and indicates how the cross-links are formed in a two-dimensional arrangement. The cross-links are in fact formed in a three-dimensional arrangement, FIGS. 2 and 3 schematically show a resist film during irradiation and after development respectively, and FIGS. 4 and 5 show infra-red spectra of cross-linked products shown in FIG. 1 and described in Example 1, before irradiation and after 40 μC/sq. cm. respectively, the transmission T being plotted against the wavenumber 1/λ. Examples 1 and 2, which are described below, are examples of system (b), while Example 4 described below is an example of system (a).

EXAMPLE 1

Methyl methacrylate/methacrylic acid copolymers were prepared using the following starting mixtures:

|  | I | II | III |
|---|---|---|---|
| Unstabilised methyl methacrylate monomer (mls) | 21.2 | 21.2 | 19 |
| Methacrylic acid (mls) | 0.19 | 0.565 | 1.7 |
| Benzoyl peroxide (g) | 0.1 | 0.1 | 0.1 |
| Toluene (mls) | 71.2 | 71.2 | 75 |
| Methacrylic acid expressed as mol. % of total polymer-forming material | 1 | 3 | 10 |

Each mixture was heated for 1 hour in a nitrogen atmosphere under reflux while stirring, on a boiling water bath, and was then cooled.

Methyl methacrylate/methacryloyl chloride copolymers were prepared using the following starting mixtures.

|  | IV | V | VI |
|---|---|---|---|
| Unstabilised methyl methacrylate monomer (mls) | 21.2 | 21.2 | 19 |
| Methacryloyl chloride (mls) | 0.21 | 0.64 | 1.93 |
| Benzoyl peroxide (g.) | 0.1 | 0.1 | 0.1 |
| Toluene | 71.6 | 71.6 | 75 |
| Methacryloyl chloride expressed as mol. % of total polymer-forming material | 1 | 3 | 10 |

These reaction mixtures were refluxed under conditions similar to those used for preparing the methyl methacrylate/methacrylic acid copolymers. Similar copolymers were produced in which the benzoyl peroxide was replaced by an equal weight of azoisobutyronitrile.

FIG. 1 shows schematically in a two-dimensional arrangement the chemical formula of a cross-linked resist film formed by mixing equal volumes of the above-mentioned reaction products III and VI, coating a substrate with a film of the mixture, drying the film and heating the dried film at 200°C for 15 minutes so as to cause the copolymers to react so as to form carboxylic acid anhydride cross-links.

Referring to FIG. 2, resist films were prepared on silicon slices by applying one of the mixed reaction products I–IV, II–V or III–VI to a silicon slice 1, and spinning the excess material off the slice, the rate of spinning being 2000–8000 r.p.m. The spun films were normally about 1 μm thick when dried but could be up to 1.5 μm thick and were still soluble in common solvents, for example acetone or methyl isobutyl ketone. The slice was then heated so as to form a resist film 2 containing carboxylic acid anhydride cross-links. A fine (1000 mesh) copper grid 3 was placed in loose contact with the resist film 2 on a silicon slice 1 so as to act as a shadow mask. The resist film was irradiated with 10 kV electrons as described by E. D. Roberts at page 571 of Proc. 3rd Int. Conf. on Electron and Ion Beam Science and Technology, Boston, May 1968, using exposures between 8 and 40 μC/sq. cm. depending upon the degree of cross-linking in the film. The irradiated film was then developed in methyl isobutyl ketone, the irradiated material being washed off leaving unirradiated areas 4 shown in FIG. 3. Table I below gives the minimum irradiation and development conditions which were found with these films. It will be seen that the sensitivity of the films to the effects of electron bombardment decreases as the degree of cross-linking increases.

TABLE I

| % cross-linkable groups | charge density (μC/sq.cm) | minutes immersion in M.I.B.K. |
|---|---|---|
| 1 | 10 | 5 |
| 1 | 15 | 2 |
| 3 | 15 | 2 |
| 3 | 20 | 1 |
| 10 | 30 – 40 | 1 |

Further experiments with grid patterns showed that the minimum exposures (expressed in μC/sq.cm) required for full development by immersion for 1 minute in methyl isobutyl ketone depended upon the heat treatment to which the mixed polymer film was subjected. Results are given in Table II.

TABLE II

| Heated for 15 minutes at | 110°C | 130°C | 150°C | 200°C |
|---|---|---|---|---|
| 3% cross-linkable groups | — | 20 | 25 | 25 |
| 10% cross-linkable groups | 10 | 20 | 35 | 40 |

The solvent resistance of films of cross-linked resists was tested by immersing coated samples in acetone or methyl isobutyl ketone and periodically weighing the coated samples in order to determine any weight loss. The films were 1 to 1.5 m thick and weighed 1000 to 1500 μg. Films containing 3 or 10 mol. of cross-linkable groups which had been heated for 15 minutes at 200°C to bring about cross-linking were completely insoluble in methyl isobutyl ketone and the 10 mol % film was completely insoluble after 15 minutes immersion in acetone. The 3 mol.% material lost about 8% by weight after the first minute of immersion in acetone, but did not suffer any further weight loss during 15 minutes immersion. By way of contrast, a 1.5 μm poly(methyl methacrylate) film dissolved completely in acetone in 1 minute and dissolved slowly but completely in methyl isobutyl ketone. It was found that fine detail patterns took longer to develop than did coarser patterns, presumably due to the physical limitations present which restrict flow of fresh solvent to the fine detail areas.

FIG. 4 shows part of the infra-red spectrum of a film produced from the mixed reaction product prepared from a III-VI mixture. The same portion of the spectrum of the same film after irradiation at 40 μC/sq. cm. but before development is shown in FIG. 5. The absorption peak at 1730 cm$^{-1}$ is probably due to unreacted acid and chloride groups, and the peak at 1810 cm$^{-1}$ is one of the peaks due to carboxylic acid anhydride groups. In the spectrum of the irradiated material, the 1810 cm$^{-1}$ peak has disappeared completely, indicating that the irradiation process has destroyed the acid-anhydride cross-links. This peak has disappeared after irradiation of every sample examined irrespective of the degree of cross-linking in the film, provided the exposure to electron irradiation has been high enough to convert the film into the soluble condition.

The main mechanism whereby the resist system operates is clearly by scission of the acid-anhydride cross-links. It seems likely that these groups may be eliminated as carbon oxides during irradiation. It is probable that there is some scission of the main methacrylate chains, similar to that which occurs in PMMA.

EXAMPLE 2

A methyl methacrylate/methacryloyl chloride copolymer containing 10 mol.% of methacryloyl chloride was prepared using the following materials:
  23.75 mls unstabilized methyl methacrylate monomer
  2.41 mls methacryloyl chloride
  12.5 mls methyl isobutyl ketone
  0.125 g benzoyl peroxide.

This mixture was heated under reflux with stirring on a boiling water bath, and thickened after 45 minutes. 81.25 mls methyl isobutyl ketone was added in portions in a period from 60 to 90 minutes after heating had commenced, and heating was discontinued after all the methyl isobutyl ketone had been added. Stirring was continued overnight so as to completely dissolve the jelly-like polymer-solvent mixture in the added methyl isobutyl ketone.

A methyl methacrylate/methacrylic acid copolymer containing 10 mol % of methacrylic acid was prepared using the following materials:
  23.75 mls unstabilised methyl methacrylate monomer
  2.13 mls methacrylic acid
  12.5 mls methyl isobutyl ketone
  0.125 g benzoyl peroxide.

This mixture was heated under reflux with stirring on a boiling water bath, and had thickened after 10 minutes. 81.25 mls methyl isobutyl ketone were added between 30 and 50 minutes after heating had commenced, and heating was stopped after 1 hour. Stirring was continued overnight so as to completely dissolve the copolymer.

A mixture of 1 volume each of the methyl methacrylate/methacryloyl chloride copolymer, the methyl methacrylate/methacrylic acid copolymer and methyl isobutyl ketone was prepared, and a smooth film was formed by applying this solution to a silicon disc and spinning the disc in an atmosphere of nitrogen saturated with methyl isobutyl ketone. The coated slice was allowed to dry and was then heated for 15 minutes at 200°C. After heating, the film was found to be completely insoluble in both acetone and methyl isobutyl ketone.

The resist film (which contained 10% of cross-linkable groups was irradiated with a pattern of 10 kV electrons as described in Example 1 using a charge density of 40 μC/sq. cm. The irradiated film was developed in methyl isobutyl ketone, giving a satisfactory positive image.

EXAMPLE 3

A methyl methacrylate/cinnamic acid copolymer was prepared using the following materials:
  23.75 g unstabilised methyl methacrylate monomer
  1.85 g cinnamic acid
  0.13 g benzoyl peroxide
  12.5 mls methyl isobutyl ketone.

This mixture was heated under reflux on a boiling water bath and stirred. The mixture had thickened considerably after 50 minutes, when 83 mls methyl isobutyl ketone were added. The resulting mixture was stirred until a homogeneous solution had been prepared, and then the solution was allowed to cool. This solution contained 5 mol.% of cinnamic acid, and contained 25% by weight of solid in methyl isobutyl ketone.

A 25% by weight solution of a methyl methacrylate/methacryloyl chloride copolymer containing 10 mol.% of methacryloyl chloride was prepared as described in Example 2.

A film-forming solution was prepared which consisted of a mixture of 2 volumes of the methyl methacrylate/cinnamic acid copolymer solution, 2 volumes of methyl isobutyl ketone and 1 volume of the methyl methacrylate/methacryloyl chloride solution. A smooth film was formed by applying the film-forming solution to a silicon disc and spinning the disc in an atmosphere of nitrogen saturated with methyl isobutyl ketone. The coated slice was allowed to dry and was then heated at 200°C for 1 hour so as to cross-link the copolymers. It was found that 45% by weight of the film was still soluble in acetone after cross-linking. The coated disc which had been immersed in acetone for 1 minute, was dried, and was then irradiated with a pattern of 10 kV electrons, as described in Example 1, using a charge density of 40 μC/sq. cm. The irradiated film was developed with methyl isobutyl ketone and gave a satisfactory positive image.

EXAMPLE 4

A styrene/methacrylic acid copolymer was prepared using the following materials:
  22 mls styrene monomer
  0.88 ml methacrylic acid
  0.125 g benzoyl peroxide
  12.5 mls methyl isobutyl ketone.

The mixture was heated under reflux with stirring on a boiling water bath for 2½ hours, and then 26.5 mls methyl isobutyl ketone was added. The solution was stirred until it had become homogeneous and was then cooled. This solution contained 40% by weight of solid which contained 5 mol % methacrylic acid.

A 25% by weight solution of a methyl methacrylate/methacryloyl chloride copolymer was prepared as described in Example 2.

A film-forming solution was prepared which consisted of one volume each of the styrene/methacrylic acid copolymer solution, the methyl methacrylate/methacryloyl chloride solution and methyl isobutyl ketone (M.I.B.K.). The solid content of the solution thus consists of 61.5% by weight of the styrene/methacrylic acid copolymer and 38.5% by weight of the methyl methacrylate/methacryloyl chloride copolymer. A film of this solution was formed on a silicon disc using the method described in the previous Examples. Table III gives the cross-linking treatment, irradiation charge density, developer and the result of the treatment. The cross-linked films were immersed in acetone for 1 minute before electron irradiation so as to remove the acetone-soluble film material.

TABLE III

| Cross-linked by heating at (°C) | for (mins) | µC/sq.cm. | developer | result |
|---|---|---|---|---|
| 125 | 30 | 50 | toluene | satisfactory |
| 125 | 60 | 50 | toluene | satisfactory |
| 150 | 15 | 50 | toluene | satisfactory |
| 200 | 15 | 50 | toluene | coloured regions |
| 200 | 15 | 70 | M.I.B.K. | satisfactory |

When the film material has been cross-linked at 125° or 150°C, approximately 15% by weight of the film was soluble in acetone. Even after cross-linking at 200°C, 11% by weight of the film was acetone-soluble. The acetone-soluble material could be homopolymer material. The cross-linked material was insoluble in acetone, toluene or methyl isobutyl ketone after immersion for 16 hours.

When the film had been cross-linked at 200°C for 15 minutes, and had been irradiated with 50 µC/sq.cm, coloured regions were observed after development. This indicates that positive action is occurring, but to an insufficient extent to permit full development. The last two lines of Table III demonstrate with reference to FIG. 7 how an increase in irradiation charge density makes it possible to obtain full development which was not obtainable with an irradiation charge density within the region J.

EXAMPLE 5

A methyl methacrylate/acrylic acid copolymer was prepared using the following mixture:

5 mls unstabilised methyl methacrylate monomer
0.1 ml acrylic acid
0.075 g benzoyl peroxide
0.075 g p-dimethyltoluidine.

A methyl methacrylate/acryloyl chloride copolymer was prepared using the following mixture:

5 mls unstabilised methyl methacrylate monomer
0.12 ml acrylyl chloride
0.075 g benzoyl peroxide
0.075 g p-dimethyltoluidine.

Both polymers were formed starting at room temperature, the catalysts present initiated bulk polymerisation. The reaction products (which contained 3% of cross-linkable groups) were dissolved in separate aliquots of 50 mls acetone. Equal volumes of the copolymer solutions were mixed, and a film of the mixed solution was spun on to a silicon slice. The film material was cross-linked by heating at 150°C for 15 minutes. After this heat treatment, the film material was insoluble in acetone after immersion for 16 hours. The film was then irradiated with a 10 kV pattern of electrons as described in Example 1, using a charge density of 25 C/sq. cm. The irradiated pattern was developed with acetone and gave a satisfactory positive image.

EXAMPLE 6

A styrene/methacrylic acid copolymer was prepared as described in Example 4.

A styrene/methacryloyl chloride copolymer was prepared using the following materials:

22 mls styrene monomer
1.0 ml methacryloyl chloride
0.125 g benzoyl peroxide
12.5 mls methyl isobutyl ketone.

This mixture was heated under reflux with stirring on a boiling water bath for 2 hours, and then 26.5 mls methyl isobutyl ketone was added. The solution was stirred until it had become homogeneous and was then cooled. This solution contained 40% by weight of solid which contained 5 mol.% methacryloyl chloride.

A film-forming solution was prepared which consisted of equal volumes of each of the copolymer solutions and of methyl isobutyl ketone. Films were spun on to silicon slices in a nitrogen atmosphere saturated with isobutyl ketone.

It was found that there was no cross-linking when a film had been heated at 75°C for 8 minutes. Another film was heated at 92°C for 4 minutes, and it was found that 70% by weight of the heated film was soluble in toluene, leaving a residual film 150 nm thick. This residual film, which was insoluble in acetone, toluene or methyl isobutyl ketone, was irradiated with a pattern of 10 kV electrons using a charge density of 50 µC/sq. cm. The irradiated film was developed with methyl isobutyl ketone to give a satisfactory positive pattern.

A film was cross-linked by heating at 200°C for 15 minutes. 14% by weight of the heated film was acetone-soluble. The heated film after immersion in acetone for 1 minute, was irradiated with a pattern of 10 kV electrons using the method described in Example 1 and a charge density of 50 µC/sq.cm. The irradiated film was developed with methyl isobutyl ketone, but the developed pattern only showed coloured regions, development being incomplete. The coloured regions indicate that there is a positive-acting resist process.

EXAMPLE 7

Styrene/methacrylic acid and styrene/methacryloyl copolymers, each containing 98 mol.% styrene, were prepared using the methods described in Examples 4 and 6 respectively, with the following starting mixtures.

| | |
|---|---|
| 22.45 mls styrene monomer | 22.45 styrene monomer |
| 0.34 mls methacrylic acid | 0.39 mls methacryloyl chloride |
| 0.13 g benzoyl peroxide | 0.13 g benzoyl peroxide |
| 12.5 mls methyl isobutyl ketone. | 12.5 mls methyl isobutyl ketone. |

A resist mixture was prepared by mixing equal volumes of methyl isobutyl ketone and each of the copolymers containing 98 mol.% styrene. Films of this resist mixture were spun on to silicon slices. Films were cross-linked by heating for 5 minutes, 10 minutes and 15 minutes at 110°C. Approximately 45% of these films were soluble in methyl isobutyl ketone, leaving residual films approximately 600 nm thick. Satisfactory positive images were obtained using an irradiation charge density of 60 $\mu$C/sq.cm. for the films which had been developed for 5 minutes and 10 minutes at 110°C. Only coloured images were obtained at 60 $\mu$C/sq. cm. for the film heated for 15 minutes at 110°C, and for other films of this resist which had been heated for longer times and at higher temperatures. Thus referring to FIG. 8, when the resist film has been heated at 110°C for 15 minutes, P > Q, but by reducing the degree of cross-linking, by reducing the time of heating at 110°C to 10 minutes, P becomes less than Q and as satisfactory positive image can be obtained.

EXAMPLE 8

A methyl methacrylate/methacrylic acid copolymer solution was prepared as described in Example 2. A vinyl acetate/methacryloyl chloride solution was prepared using the following materials:

22 mls vinyl acetate
1.20 mls methacryloyl chloride
0.125 g benzoyl peroxide
12.5 mls methyl isobutyl ketone.

This mixture was heated under reflux with stirring on a boiling water bath for 3½ hours, and then 25 mls methyl isobutyl ketone was added to give a 40% by weight solution of solid, which was homogenised and allowed to cool.

A film-forming solution was prepared using equal volumes of methyl isobutyl ketone, and of each of the copolymer solutions. Films were formed on silicon discs by spinning on this solution. Table IV shows the results obtained for different films.

TABLE IV

| Cross-linked by heating at (°C) | for (mins) | $\mu$C/sq.cm. | % film soluble in M.I.B.K. | result |
|---|---|---|---|---|
| 115 | 5 | 20–50 | 37 | satisfactory positive image |
| 115 | 10 | 50 | 35 | " |
| 115 | 15 | 60 | 25 | " |
| 133 | 5 | 50 | — | " |

Each film was immersed for 1 minute in acetone after heating and before irradiation. It appears that the film-forming solution contains a considerable proportion of homopolymer.

What we claim is:

1. A cross-linkable positive working electron resist comprising a mixture of copolymers A - B and D - E wherein:

A is an unsaturated carboxylic acid of the formula

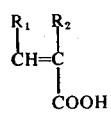
COOH

B is an unsaturated organic compound of the formula

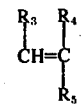

D is an unsaturated acid chloride of the formula

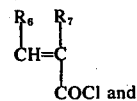
and

E is an unsaturated compound of the formula

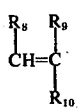

wherein $R_1$, $R_2$, $R_3$, $R_4$, $R_6$, $R_7$, $R_8$ and $R_9$ are each moieties selected from the group consisting of aryl, alkyl and hydrogen, $R_5$ and $R_{10}$ are each moieties selected from the group consisting of alkyl, saturated acyloxy, aryl and -COOR wherein R is alkyl, wherein the mixture contains essentially stoichiometric + or −50% quantities of A and D and wherein from 0.5 – 7.5 mol % of the mixture consists of A.

2. A cross-linkble positive-working electron resist as claimed in claim 1, wherein the alkyl groups are methyl or ethyl groups.

3. A cross-linkable positive-working electron resist as claimed in claim 1, wherein none of $R_4$, $R_5$, $R_9$ and $R_{10}$ is a hydrogen atom.

4. A method of producing a resist pattern on a substrate, comprising the steps of applying a coating of a cross-linkable positive-working electron resist as claimed in claim 1 to the substrate, heating the coated substrate so as to form carboxylic acid anhydride cross-links between the groups A and D of the co-polymers A-B and D-E, irradiating the cross-linked resist coating with electrons in accordance with a desired pattern until the acid anhydride cross-links have been broken, and developing the irradiated coating by means of a solvent so as to leave the positive resist pattern on the substrate.

5. A substrate bearing a resist pattern produced by the method of claim 4.

6. A method as claimed in claim 1, wherein the irradiated coating is developed with acetone, methyl ethyl ketone, methyl isobutyl ketone or toluene.

7. A method as claimed in claim 5, wherein before irradiation of the coating with electrons noncross-linked material is leached from the coating by means of a solvent.

8. A cross-linkable positive-working electron resist as claimed in claim 10 wherein B and E are methyl methacrylate, A is methacrylic acid and D is methacryloyl chloride.

* * * * *

UNITED STATES PATENT AND TRADEMARK OFFICE
CERTIFICATE OF CORRECTION

PATENT NO. : 3,981,985
DATED : September 21, 1976
INVENTOR(S) : EDWARD DAVID ROBERTS It is certified that error appears in the above-identified patent and that said Letters Patent are hereby corrected as shown below:

Col. 11, line 1, "1" should be -- 4 --.

Col. 11, line 4, "5" should be -- 4 --.

Col. 12, line 2, "10" should be -- 1 --.

Signed and Sealed this fifth Day of July 1977

[SEAL]

Attest:

RUTH C. MASON
Attesting Officer

C. MARSHALL DANN
Commissioner of Patents and Trademarks